United States Patent [19]
Ikeda et al.

[11] Patent Number: 5,956,361
[45] Date of Patent: Sep. 21, 1999

[54] SEMICONDUCTOR LASER AND A METHOD FOR PRODUCING THE SAME

[75] Inventors: Hiroaki Ikeda, Shijonawate; Ken Ohbayashi, Nara-ken, both of Japan

[73] Assignee: Sharp Kabushiki Kaisha, Osaka, Japan

[21] Appl. No.: 08/785,242

[22] Filed: Jan. 17, 1997

[30] Foreign Application Priority Data

Jan. 19, 1996 [JP] Japan .................................. 8-007382

[51] Int. Cl.$^6$ ....................................................... H01S 3/19
[52] U.S. Cl. ................................................ 372/46; 372/45
[58] Field of Search ......................................... 372/46, 45

[56] References Cited

U.S. PATENT DOCUMENTS

| | | | |
|---|---|---|---|
| 5,029,175 | 7/1991 | Ohnaka et al. | 372/46 |
| 5,297,158 | 3/1994 | Naitou et al. | 372/46 |
| 5,316,967 | 5/1994 | Kaneno et al. | 437/105 |
| 5,400,354 | 3/1995 | Ludowise et al. | 372/45 |
| 5,426,658 | 6/1995 | Kaneno et al. | 372/46 |
| 5,636,236 | 6/1997 | Tada et al. | 372/45 |

FOREIGN PATENT DOCUMENTS

| | | |
|---|---|---|
| 0385388 | 9/1990 | European Pat. Off. . |
| 0616399 | 9/1994 | European Pat. Off. . |
| 4240539 | 7/1993 | Germany . |
| 3-97286 | 4/1991 | Japan . |
| 5-160503 | 6/1993 | Japan . |

OTHER PUBLICATIONS

Patent Abstracts of Japan, vol. 015, No. 280 (E–1090), Jul. 16, 1991, & JP 03 097286 A (Mitsubishi Electric Corp.), Apr. 23, 1991.

*Primary Examiner*—Rodney Bovernick
*Assistant Examiner*—Yisun Song
*Attorney, Agent, or Firm*—Morrison & Foerster LLP

[57] ABSTRACT

A semiconductor laser device according to the present invention includes: a semiconductor substrate having a first conductivity type; and a semiconductor multilayer structure provided on the semiconductor substrate, the semiconductor multilayer structure including an active layer. The semiconductor multilayer structure includes: a lower cladding layer provided below the active layer, the lower cladding layer having the first conductivity type, an upper cladding structure provided above the active layer, the upper cladding structure having a second conductivity type; and a cap layer provided above the upper cladding structure. A ridge is formed in the upper cladding structure, and a width of a lower face of the cap layer is larger than a width of an upper face of the ridge.

37 Claims, 14 Drawing Sheets

SEMICONDUCTOR LASER AND A METHOD FOR PRODUCING THE SAME

BACKGROUND OF THE INVENTION

1. Field of the Invention

The present invention relates to a highly reliable semiconductor laser and a method for producing the same which requires relatively small power consumption.

2. Description of the Related Art

Various techniques have been explored for providing a highly reliable semiconductor laser which requires relatively small power consumption. For example, Japanese Laid-Open Patent Publication No.5-160503 discloses a semiconductor laser device having a ridge guide structure of a so-called actual refractive index guide type.

Referring to FIG. 8, the above-mentioned conventional semiconductor laser is described. This semiconductor laser includes an n-GaAs buffer layer 202 (thickness: about 0.5 $\mu$m), an n-$Al_{0.5}Ga_{0.5}As$ lower cladding layer 203 (thickness: about 1 $\mu$m), an n-$Al_{0.15}Ga_{0.85}As$ active layer 204 (thickness: about 0.07 $\mu$m), a p-$Al_{0.5}Ga_{0.5}As$ upper cladding layer 221 (thickness: about 1 $\mu$m in a ridge portion and about 0.15 $\mu$m in regions other than the ridge), a p-GaAs cap layer 208 (thickness: about 0.2 $\mu$m), an n-$Al_{0.65}Ga_{0.35}As$ current blocking layer 209 (thickness: about 0.5 $\mu$m), an n-GaAs protection layer 220 (thickness: about 0.5 $\mu$m), and a p-GaAs contact layer 212 (thickness: about 3 $\mu$m) formed on an n-GaAs substrate 201. A ridge 213 is formed in the upper cladding layer 221.

Hereinafter, a method for producing the above-mentioned conventional semiconductor laser is described with reference to FIGS. 9A to 9D.

First, in the first stage of semiconductor layer crystal growth shown in FIG. 9A, the n-GaAs buffer layer 202, the n-$Al_{0.5}Ga_{0.5}As$ lower cladding layer 203, the $Al_{0.15}Ga_{0.85}As$ active layer 204, the p-$Al_{0.5}Ga_{0.5}As$ upper cladding layer 221, and the p-GaAs cap layer 208 are sequentially formed on the n-GaAs substrate 201 (Stop A).

Next, as shown in FIG. 9B, a dielectric film 216 (e.g., nitride or silicon oxide film) is formed in a striped shape on the p-GaAs cap layer 208. By using the dielectric film 216 as a mask, the p-GaAs cap layer 208 and the p-$Al_{0.5}Ga_{0.5}As$ upper cladding layer 221 are partially etched away, thereby leaving a ridge 213 (Step B).

Next, in the second stage of semiconductor layer crystal growth shown in FIG. 9C, by using the dielectric film 216 again as a mask, the n-$Al_{0.65}Ga_{0.35}As$ current blocking layer 209 and the n-GaAs protection layer 220 are selectively grown so as to be present only on the side faces of the p-GaAs cap layer 208 and on the p-$Al_{0.5}Ga_{0.5}As$ upper cladding layer 221 by MOCVD (metal organic chemical vapor deposition) (Step C).

Next, as shown in FIG. 9D, the dielectric film 216 is removed. In a third stage of semiconductor layer crystal growth, the p-GaAs contact layer 212 is formed so as to cover all of the portions of the p-GaAs cap layer 208, the n-$Al_{0.65}Ga_{0.35}As$ current blocking layer 209, and the n-GaAs protection layer 220 that are exposed on the surface (Step D).

Finally, an electrode is formed on each of the n-GaAs substrate 201 and the p-GaAs contact layer 212 to complete the semiconductor laser. The above-described conventional semiconductor laser achieves laser oscillation by confining light and an electric current in a region below the $Al_{0.15}Ga_{0.85}As$ active layer 204.

As described above, the above conventional semiconductor laser has a ridge guide structure where a portion of the p-$Al_{0.5}Ga_{0.5}As$ upper cladding layer 221 defines the ridge 213. At Step B, the p-$Al_{0.5}Ga_{0.5}As$ upper cladding layer 221 is inevitably exposed to the atmosphere after the formation of the ridge 213. In general, a portion of an AlGaAs layer exposed to the atmosphere forms a deep energy level because of its Al content, which is an element relatively susceptible to oxidation. This causes the AlGaAs layer to absorb some light, thereby degrading the reliability of the semiconductor laser. In contrast, in the above-mentioned conventional semiconductor laser, the portion which was actually exposed to the atmosphere is located at a certain distance from the active region thereof, so that the unfavorable light absorption occurring in such exposed portions is substantially reduced. Thus, the above-mentioned conventional semiconductor laser attains a high reliability.

Moreover, the conventional semiconductor laser confines light along the horizontal direction only in terms of the actual refractive index, i.e., by providing the n-$Al_{0.65}Ga_{0.35}As$ current blocking layer 209 (having a smaller refractive index than that of the p-$Al_{0.5}Ga_{0.5}As$ upper cladding layer 221) on the outside of the ridge 213 of the p-$Al_{0.5}Ga_{0.5}As$ upper cladding layer 221. Since this structure (often referred to as the "actual refractive index guide type structure") attains the horizontal confinement of light without utilizing light absorption, it can reduce the propagation lose during laser oscillation, which in turn reduces the power consumption of the laser.

In the above-mentioned method for producing a conventional semiconductor laser device, the dielectric film 216 is layered above the ridge 213 during the step of forming the ridge 213. During the subsequent MOCVD growth, the n-$Al_{0.65}Ga_{0.35}As$ current blocking layer 209 and the n-GaAs protection layer 220 are selectively formed only in regions other than in the dielectric film 216. As a result, the n-$Al_{0.65}Ga_{0.35}As$ current blocking layer 209 and the n-GaAs protection layer 220 are prevented from being formed on the ridge 213 during the second crystal growth.

Moreover, the n-$Al_{0.65}Ga_{0.35}As$ current blocking layer 209 and the n-GaAs protection layer 220 of the conventional device are formed during the second crystal growth. Although the n-$Al_{0.65}Ga_{0.35}As$ current blocking layer 209 would suffice to confine light and an electric current, the n-GaAs protection layer 220 ensures that GaAs (which is relatively immune to oxidation) extends over a large region of the surface of the device before the third crystal growth. Thus, the crystallinity of the p-GaAs contact layer 212 formed through the third crystal growth improves as compared with the case where the n-GaAs protection layer 220 is not provided.

HF (hydroxy fluoride) is generally used for etching away the dielectric film 216. In the conventional semiconductor laser device, the n-GaAs protection layer 220 provided on the n-$Al_{0.65}Ga_{0.35}As$ current blocking layer 209 makes it possible to use HF for etching away the dielectric film 216. Specifically, HF is capable of etching an $Al_xGa_{1-x}As$ layer where x is equal to or larger than 0.4 at a fast etching rate, but the n-GaAs protection layer 220 prevents the n-$Al_{0.65}Ga_{0.35}As$ current blocking layer 209 from being etched during the process of etching the dielectric film 216.

However, the inventors of the present invention attempted producing the above-described conventional semiconductor laser device and tested its operation, which revealed a number of problems which are described below.

Firstly, the aforementioned conventional semiconductor laser device requires a higher driving voltage than those of lasers of other structures existing prior to this device. A study by the present inventors revealed that the crystallinity of the p-GaAs contact layer 212 in regions where it comes in contact with the n-Al$_{0.65}$Ga$_{0.35}$As current blocking layer 209 deteriorates so that such regions become highly resistive.

More specifically, in the aforementioned conventional semiconductor laser, the n-Al$_{0.65}$Ga$_{0.35}$As current blocking layer 209 and the n-GaAs protection layer 220 are formed during the second crystal growth, thereby ensuring that a large region of the surface of the device before the third crystal growth is GaAs (which is relatively immune to oxidation) so as to improve the crystallinity of the p-GaAs contact layer 212 formed through the third crystal growth. However, a certain width of n-Al$_{0.65}$Ga$_{0.35}$As current blocking layer 209 is present on each side of the p-GaAs cap layer 208 (defining part of the ridge) on the surface of the laser device prior to the third crystal growth. In the aforementioned semiconductor laser device produced by the present inventors, the width of the above-mentioned portion (appearing on each side of the p-GaAs cap layer 208 on the surface) of the n-Al$_{0.65}$Ga$_{0.35}$As current blocking layer 209 was about 0.47 μm, which is only slightly smaller than the thickness (about 0.5 μm) of the portions of the n-Al$_{0.65}$Ga$_{0.35}$As current blocking layer 209 present above the p-Al$_{0.5}$Ga$_{0.5}$As upper cladding layer 221 in regions other than the ridge. Owing to the oxidation of the Al content in the n-Al$_{0.65}$Ga$_{0.35}$As current blocking layer 209, the crystallinity of the region of the p-GaAs contact layer 212 (formed through the third crystal growth) on the n-Al$_{0.65}$Ga$_{0.35}$As current blocking layer 209 may deteriorate, thereby increasing the resistivity of the region. Since an electric current concentrates in the portion of the p-GaAs contact layer 212 adjacent to the ridge, any increase in resistivity has a large undesired influence in this region, thereby substantially increasing the driving voltage of the semiconductor laser.

Moreover, the n-GaAs protection layer 220 of the aforementioned conventional semiconductor laser, which is provided on the n-Al$_{0.65}$Ga$_{0.35}$As current blocking layer 209, is intended to prevent the n-Al$_{0.65}$Ga$_{0.35}$As current blocking layer 209 from being etched during the process of etching the dielectric film 212 with HF. However, the n-Al$_{0.65}$Ga$_{0.35}$As current blocking layer 209 is still susceptible to etching by HF in the regions appearing on both sides of the p-GaAs cap layer 208 at the ridge. If the n-Al$_{0.65}$Ga$_{0.35}$As current blocking layer 209 is overly etched, the semiconductor laser may not oscillate.

Secondly, the aforementioned conventional semiconductor laser device has a short life under continuous operation. This problem may be caused by dislocations occurring within the device, which are presumably caused by the use of a nitride film in the production process. Specifically, the production of the conventional semiconductor laser involves an MOCVD selective growth, which utilizes the dielectric film 216 formed on the p-GaAs cap layer 208. The MOCVD selective growth is generally conducted at a temperature from about 650° C. to about 800° C. If a dielectric film formed on a semiconductor layer is exposed to such a high temperature, the semiconductor layer experiences a large amount of stress owing to the difference in the thermal expansion coefficient between the semiconductor layer and the dielectric film, thereby allowing a large number of dislocations to be generated. In general, the reliability of the semiconductor laser substantially decreases as the number of dislocations generated in the laser emission region increases. It is contemplated that the aforementioned conventional laser device includes a number of locations in the laser emission region thereof, thereby resulting in the short operation life thereof.

Thirdly, the MOCVD selective growth of the AlGaAs layer utilizing a dielectric film requires a corrosive gas, e.g., HCl, to be simultaneously used, thereby making it difficult to handle and/or maintain the MOCVD device.

SUMMARY OF THE INVENTION

In one aspect, the present invention provides a semiconductor laser device including: a semiconductor substrate having a first conductivity type; and a semiconductor multilayer structure provided on the semiconductor substrate, the semiconductor multilayer structure including an active layer, wherein the semiconductor multilayer structure further includes: a lower cladding layer provided below the active layer, the lower cladding layer having the first conductivity type; an upper cladding structure provided above the active layer, the upper cladding structure having a second conductivity type; and a cap layer provided above the upper cladding structure, the cap layer having the second conductivity type, and wherein a ridge is formed in the upper cladding structure, and a width of a lower face of the cap layer is larger than a width of an upper face of the ridge.

In one embodiment of the invention, the semiconductor multilayer structure further includes: a current blocking layer substantially interposing the cap layer and the ridge on both sides, the current blocking layer having the first conductivity type; and a protection layer substantially interposing the current blocking layer substantially on both sides.

In another embodiment of the invention, the active layer has a refractive index larger than a refractive index of the lower cladding layer and a refractive index of the upper cladding structure, and the current blocking layer has a refractive index smaller then the refractive index of the upper cladding structure.

In still another embodiment of the invention, the upper cladding structure and the current blocking layer include Al; and the cap layer and the protection layer include zero or more Al, the cap layer including less Al than the upper cladding structure, and the protection layer including less Al than the current blocking layer.

In still another embodiment of the invention, the upper cladding structure includes: a first upper cladding layer having the second conductivity type; an etching stop layer having the second conductivity type; and a second upper cladding layer having the second conductivity type, and the ridge is substantially formed in the second upper cladding layer.

In still another embodiment of the invention, the etching stop layer includes a composition different from a composition of the first upper cladding layer and a composition of the second upper cladding layer.

In still another embodiment of the invention, each of side faces of the cap layer constitutes about 90° or more with respect to the lower face of the cap layer.

In still another embodiment of the invention, each of side faces of the upper cladding structure constitutes about 90° or less with respect to a lower face of the upper cladding structure.

In still another embodiment of the invention, the semiconductor laser device satisfies the relationship 0.3 μm<W2−W3<3 μm, where W2 is a width of the lower face of the cap layer; and W3 is a width of the upper face of the ridge.

In still another embodiment of the invention, the semiconductor laser device satisfies the relationship (W1−W3)/2d1<3, where W1 is a width of the upper face of the cap layer; W3 is a width of the upper face of the ridge; and d1 is a thickness of the cap layer.

In still another embodiment of the invention, the protection layer includes at least a first protection layer and a second protection layer, which are arranged so that the first protection layer is substantially interposed between the second protection layer and the current blocking layer, the first protection layer having the first conductivity type, and the second protection layer having second conductivity type.

In still another embodiment of the invention, the semiconductor laser device satisfies the relationship d2>0.2 μm, wherein d2 is a thickness of the current blocking layer.

In still another embodiment of the invention, the semiconductor laser device satisfies the relationship d2+d3>0.4 μm, wherein d2 is a thickness of the current blocking layer; and d3 is a thickness of the first protection layer.

In another aspect, the present invention provides a method for producing a semiconductor laser, the method including the steps of: depositing, in this order, a lower cladding layer having a first conductivity type, an active layer, an upper cladding structure having a second conductivity type, and a cap layer having the second conductivity type on a semiconductor substrate having the first conductivity type; forming a strips-shaped first etching protection film on the cap layer, the stripe-shaped first etching protection film functioning as a mask; forming a ridge in the upper cladding structure by etching away predetermined regions of the cap layer and the upper cladding structure which are not substantially covered by the mask, the ridge having an upper face having a width smaller than a width of a lower face of the cap layer.

In one embodiment of the invention, the upper cladding structure is etched at an etching speed faster than an etching speed for the cap layer during the step of forming a ridge.

In another embodiment of the invention, the step of depositing the upper cladding structure comprises a step of depositing, in this order, a first upper cladding layer having the second conductivity type, an etching stop layer having the second conductivity type, and a second upper conductivity type having the second conductivity type; and the step of forming a ridge having an upper face having a width smaller than a width of a lower face of the cap layer forms the ridge in the second upper cladding by etching away predetermined regions of the cap layer and the second upper cladding layer of the upper cladding structure which are not substantially covered by the mask so as to form a ridge in the upper cladding structure.

In still another embodiment of the invention, the second upper cladding layer is etched at an etching speed faster then an etching speed for the cap layer during the step of forming a ridge.

In still another embodiment of the invention, the etching stop layer has a composition different from a composition of the first upper cladding layer and a composition of the second upper cladding layer.

In still another embodiment of the invention, the method further includes, subsequent to the step of forming a ridge, the steps of: forming, in this order, a current blocking layer having the first conductivity type and a protection layer so that the current blocking layer and the protection layer substantially cover the cap layer and side faces of the ridge; forming a second etching protection film in regions other than a uppermost portion of the protection layer projecting upward above the cap layer; and removing a portion of the protection layer and the current blocking layer that is formed above the cap layer.

In still another embodiment of the invention, the step of removing a portion of the protection layer and the current blocking layer comprises a step of selectively removing only the protection layer by an etching which provides a faster etching speed for the protection layer than for the current blocking layer.

In still another embodiment of the invention, the step of removing a portion of the protection layer and the current blocking layer comprises a step of, after selectively removing only the protection layer, etching the current blocking layer by an etching which provides a substantially equal etching speed for both the protection layer and the current blocking layer.

In still another embodiment of the invention, the step of etching the current blocking layer includes a step of etching the side faces of the cap layer, the current blocking layer in the vicinity of the side faces of the cap layer, and the protection layer.

In still another embodiment of the invention, the active layer has a refractive index larger than a refractive index of the lower cladding layer and a refractive index of the upper cladding structure, and the current blocking layer has a refractive index smaller than the refractive index of the upper cladding structure.

In still another embodiment of the invention, the upper cladding structure and the current blocking layer include Al; and the cap layer and the protection layer include zero or more Al, the cap layer including less Al than the upper cladding structure, and the protection layer including less Al than the current blocking layer.

The semiconductor laser according to the present invention is constructed so that the width of the cap layer becomes larger than the width of the uppermost portion of the upper cladding layer during the first stage of crystal growth. As a result, when forming the current blocking layer and the protection layer(s) in the second stage of semiconductor crystal growth using a MOCVD growth method, the thickness of the portions of the Al-containing current blocking layer adjacent to the ridge can be reduced. In other words, the exposed portion of the Al-containing current blocking layer (which is susceptible to oxidation) is reduced. Specifically, the area of the side faces of the ridge is increased so as to relatively reduce the amount of material supplied along the ridge side feces, thereby resulting in a relatively slow growth rate along the ridge side faces. As a result, the deterioration in the crystallinity of the contact layer formed through the third stage of crystal growth is confined in only the small regions adjacent to the ridge side faces, whereby the driving voltage of the semiconductor laser is prevented from increasing.

In the case where an etching is performed by using HF or the like after the second stage of crystal growth, the current blocking layer can be more effectively prevented from being etched than in conventional techniques because of the small width of the portions of the current blocking layer adjacent to the ridge side faces.

According to the method for producing a semiconductor laser of the present invention, the second stage of crystal growth is performed without using a dielectric film so that the semiconductor layers are prevented from having dislocations. Moreover, since it is unnecessary to employ a corrosive gas, it facilitates the management and operation of the MOCVD apparatus.

Furthermore, according to the production method of the present invention, the current blocking layer (containing a relatively large amount of Al) and the protection layer(s) (containing a relatively small amount of Al) are sequentially formed. Next, when removing the layers formed above the ridge, the protection layer(s) is selectively etched, whereafter the remaining layer(s) on the ridge are etched away. By dividing the etching process into two steps, it becomes possible to complete the selective etching of the cap layer and the etching of the other layers in relatively short time periods. As a result, the occurrence of unsatisfactory products due to excessive or insufficient etching can be reduced.

Thus, the invention described herein makes possible the advantages of (1) providing a low-resistance semiconductor laser device in which the crystallinity of the contact layer is improved; (2) providing a highly reliable semiconductor laser in which dislocations are prevented from occurring in the active region; and (3) a method for producing such semiconductor laser devices.

These and other advantages of the present invention will become apparent to those skilled in the art upon reading and understanding the following detailed description with reference to the accompanying figures.

DESCRIPTION OF THE PREFERRED EMBODIMENTS

Hereinafter, with reference to the accompanying figures, the present invention will be described by way of illustrative examples.

EXAMPLE 1

A semiconductor laser according to Example 1 of the present invention will be described with reference to FIG. 1.

Figure 1:
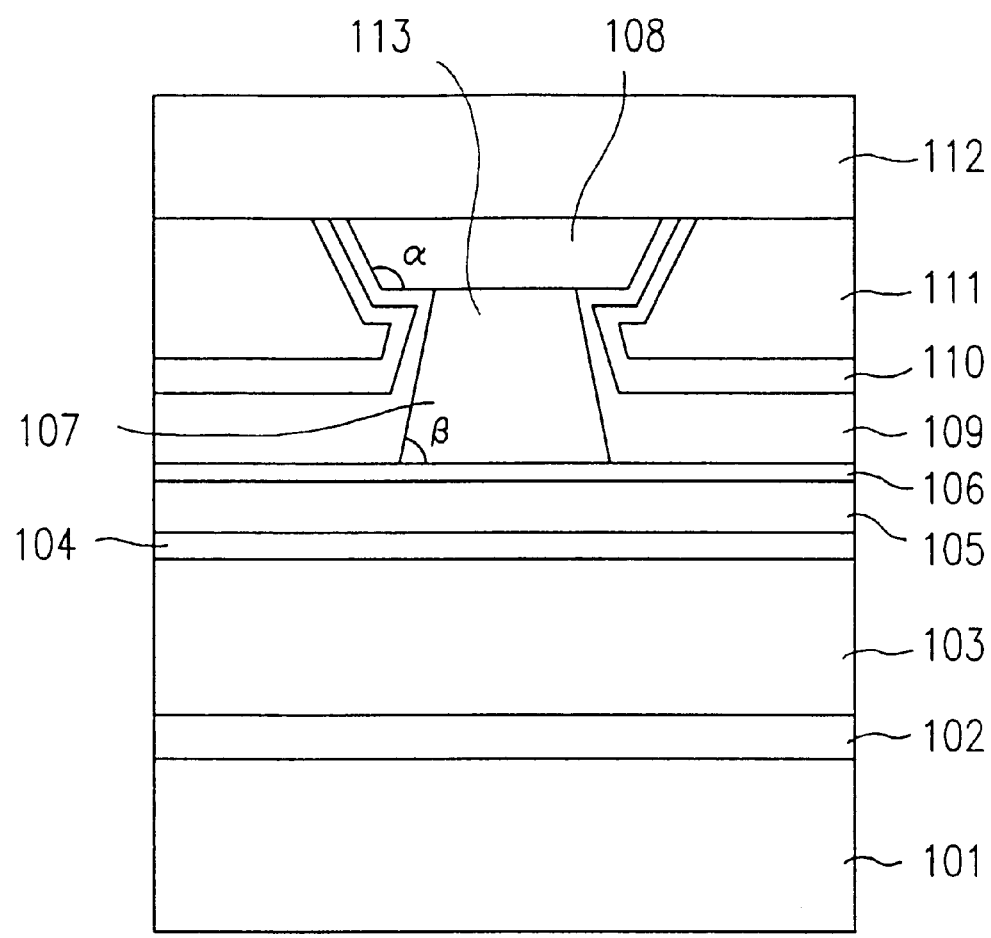
FIG. 1 is a cross-sectional view showing a semiconductor laser device according to Example 1 of the prevent invention.

The semiconductor laser shown in FIG. 1 includes a semiconductor multilayer structure (including a plurality of semiconductor layers which are epitaxially grown) formed on an n-GaAs substrate 101 (thickness: about 50 $\mu$m to about 130 $\mu$m).

The semiconductor multilayer structure includes: an n-GaAs buffer layer 102 (thickness: about 0.1 $\mu$m to about 1.0 $\mu$m), an n-$Al_xGa_{1-x}$As lower cladding layer 103 (thickness: about 0.5 $\mu$m to about 2.0 $\mu$m) (0.45≦x≦0.65), an $Al_yGa_{1-y}$As active layer 104 (thickness: about 0.01 $\mu$m to about 0.1 $\mu$m) (0.07≦y≦0.16), a p-$Al_zGa_{1-z}$As first upper cladding layer 105 (thickness: about 0.1 $\mu$m to about 0.4 $\mu$m) (0.45≦z≦0.65), and a p-GaAs etching stop layer 106 (thickness: about 0.002 $\mu$m to about 0.004 $\mu$m), which are laminated in this order on the substrate 101.

Furthermore, the semiconductor multilayer structure includes a p-$Al_uGa_{1-u}$As second upper cladding layer 107 (thickness: about 0.3 $\mu$m to about 1.5 $\mu$m) (0.45≦u≦0.65) having a ridge 113 and a p-GaAs cap layer 108 (thickness: about 0.2 $\mu$m to about 1.0 $\mu$m) above and in the vicinity of the central portion of the p-GaAs etching stop layer 106. The p-GaAs cap layer 108 is formed on the second upper cladding layer 107. Moreover, the semiconductor multilayer structure includes an n-$Al_vGa_{1-v}$As current blocking layer 109 (thickness: about 0.2 $\mu$m to about 1.0 $\mu$m) (0.5≦v≦0.85) and an n-GaAs first protection layer 110 (thickness: about 0.2 $\mu$m to about 1.0 $\mu$m), and a p-GaAs second protection layer 111 (thickness: about 0.5 $\mu$m to about 1.5 $\mu$m) laminated in this order away from the substrate 101. The layers 109, 110, and 111 are formed so as to interpose the second upper cladding layer 107 and the cap layer 108 on both sides. A p-GaAs contact layer 112 (thickness: about 70 $\mu$m) is further formed on the cap layer 108.

Herein, x, y, z, u, and v represent respective component ratios where v>u and x, z, u>y.

The width of the lower face of the p-GaAs cap layer 108 is prescribed at a value larger than the width of the upper face of the p-$Al_uGa_{1-u}$As second upper cladding layer 107. The width of the lowermost portion of the p-$Al_uGa_{1-u}$As second upper cladding layer 107 (which defines the lowermost portion of the ridge) is prescribed at about 0.5 $\mu$m to about 5.0 $\mu$m. The p-GaAs cap layer 108 is formed in such a manner that each side face constitutes an angle of 90° or more with respect to the bottom face. The p-$Al_uGa_{1-u}$As second upper cladding layer 107 is formed in such a manner that each side face constitutes an angle of 90° or less wits respect to the bottom face.

Now, a method for producing the above-mentioned semiconductor laser shown in FIG. 1 is described with reference to FIGS. 6A to 6J.

Figure 6A:
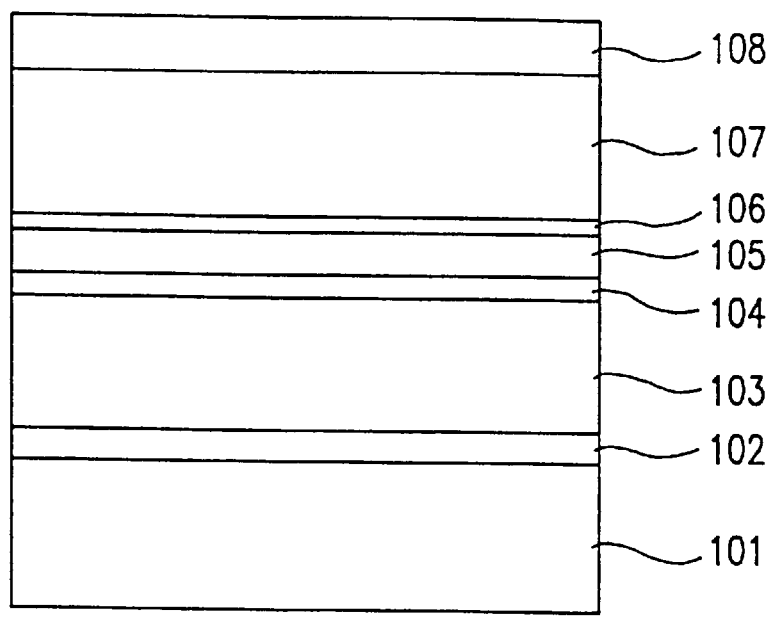
FIGS. 6A to 6J are cross-sectional views illustrating respective production steps of a semiconductor laser device according to Example 1 of the present invention.

First, in the first stage of semiconductor layer crystal growth shown in FIG. 6A, the n-GaAs buffer layer 102, the n-$Al_xGa_{1-x}$As lower cladding layer 103, the $Al_yGa_{1-y}$As active layer 104, the p-$Al_zGa_{1-z}$As first upper cladding layer 105, the p-GaAs etching stop layer 106, the p-$Al_uGa_{1-u}$As second upper cladding layer 107, and the p-GaAs cap layer 108 are grown in this order on the n-GaAs substrate 101 (by using MOCVD growth technique, for example).

Figure 6B:
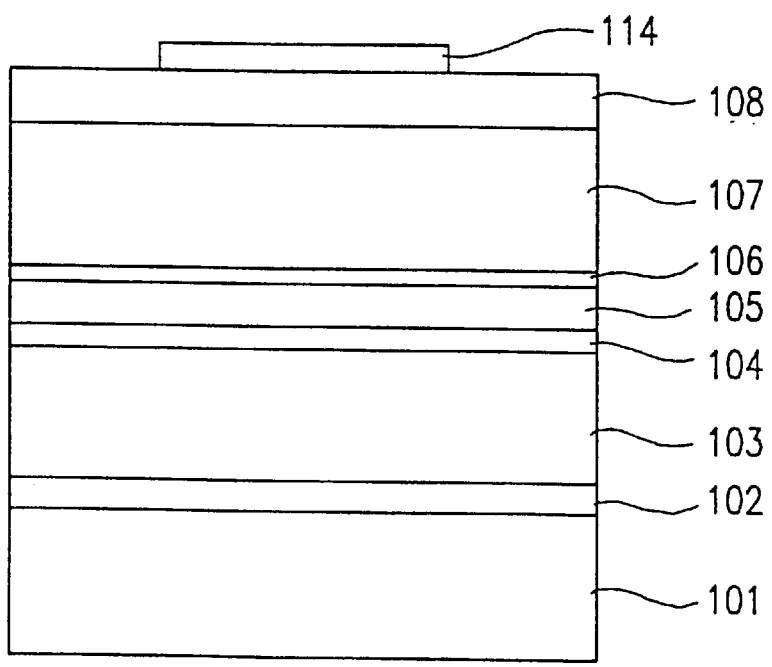

Next, as shown in FIG. 6B, a resist film 114 is formed in a striped shape (in the (011) orientation) on the p-GaAs cap layer 108 by using known photolithography techniques.

Figure 6C:
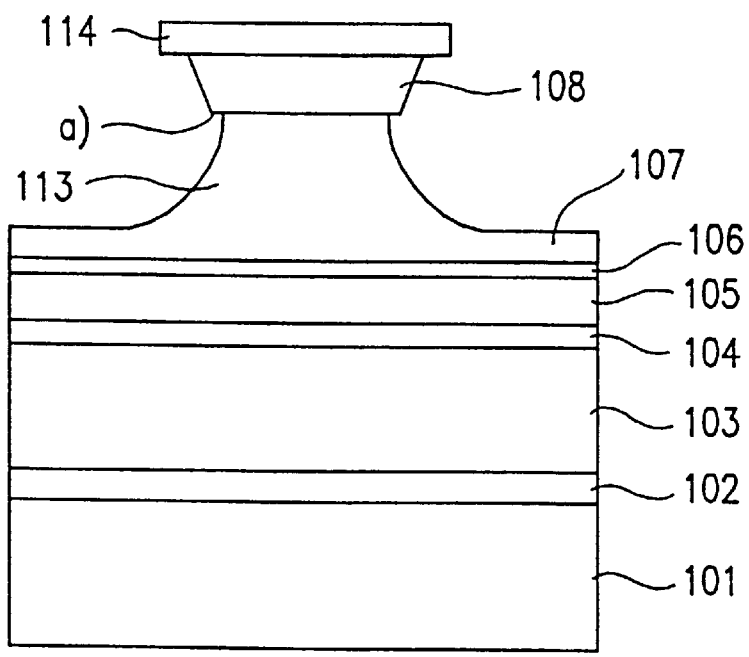

Next, as shown in FIG. 6C, the p-GaAs cap layer 108 and the p-$Al_uGa_{1-u}$As second upper cladding layer 107 are partially etched in regions where the resist film 114 is not formed. This etching process is performed by a method which provides little selectivity between AlGaAs and GaAs. The etching time is controlled so that a portion of the p-$Al_uGa_{1-u}$As second upper cladding layer 107 remains on the entire upper face of the p-GaAs etching stop layer 106 without completely removing the p-$Al_uGa_{1-u}$As second upper cladding layer 107.

The etching method can be, for example, wet etching using a mixture of $H_2SO_4:H_2O_2:H_2O=1:8:50$ as an etchant. Since this etchant has some anisotropy in the etching speed for GaAs, the p-GaAs cap layer 108 can be etched into a so-called reversed mesa shape where each side face thereof constitutes an angle of 90° or more with respect to the bottom face thereof, by etching the GaAs in a striped shape along the (011) orientation. Since this etchant has a slightly faster etching speed for AlGaAs than GaAs, the width of the lower face of the p-GaAs cap layer 108 can be made larger than the width of the upper face of the p-AlGaAs second upper cladding layer 107 after the etching.

Figure 6D:
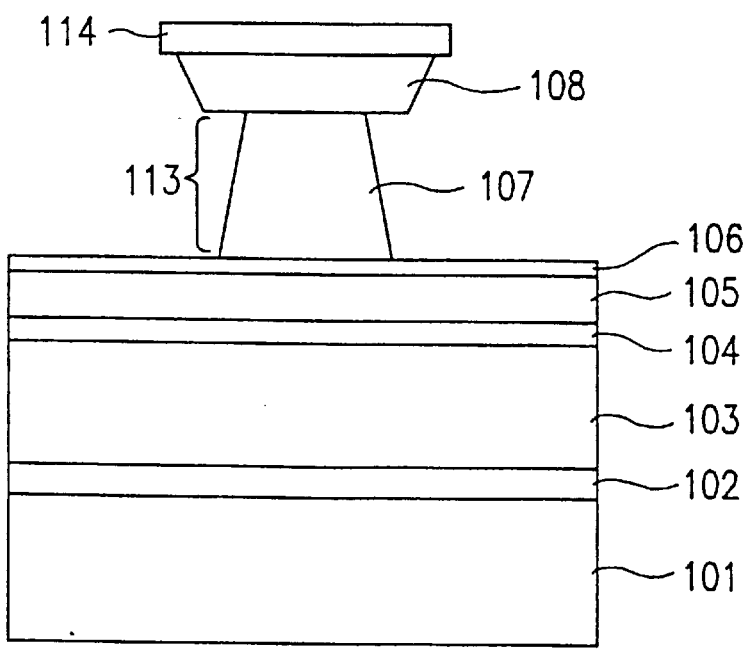

Next, as shown in FIG. 6D, the p-AlGaAs second upper cladding layer 107 is selectively etched by using an etchant which provides a slower etching speed for GaAs than AlGaAs. As a result, the p-$Al_uGa_{1-u}As$ second upper cladding layer 107 is etched away in regions where the resist film 114 is not formed so that the remainder of the p-$Al_uGa_{1-u}As$ second upper cladding layer 107 forms the ridge 113. It is ensured that the ridge 113 is shaped so that the width of (both the upper face and the lower face of) the p-GaAs cap layer 108 is larger than the width of (both the upper face and the lower face of) the p-$Al_uGa_{1-u}As$ second upper cladding layer 107. HF can be suitably used as the etchant, for example. The resist film 114 is removed after this etching process.

Figure 6E:
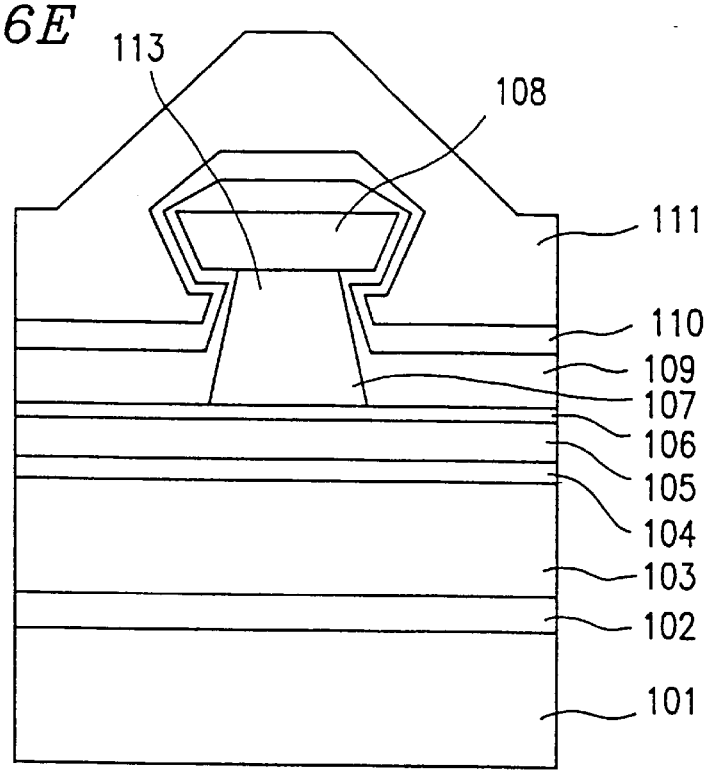

Next, in the second stage of semiconductor layer crystal growth shown in FIG. 6E, (after the resist film 114 is removed), the n-$Al_vGa_{1-v}As$ current blocking layer 109, the n-GaAs first protection layer 110 and the p-GaAs second protection layer 111 are grown on the entire upper face of the etching stop layer 106 in this order by using MOCVD growth techniques.

Figure 6F:
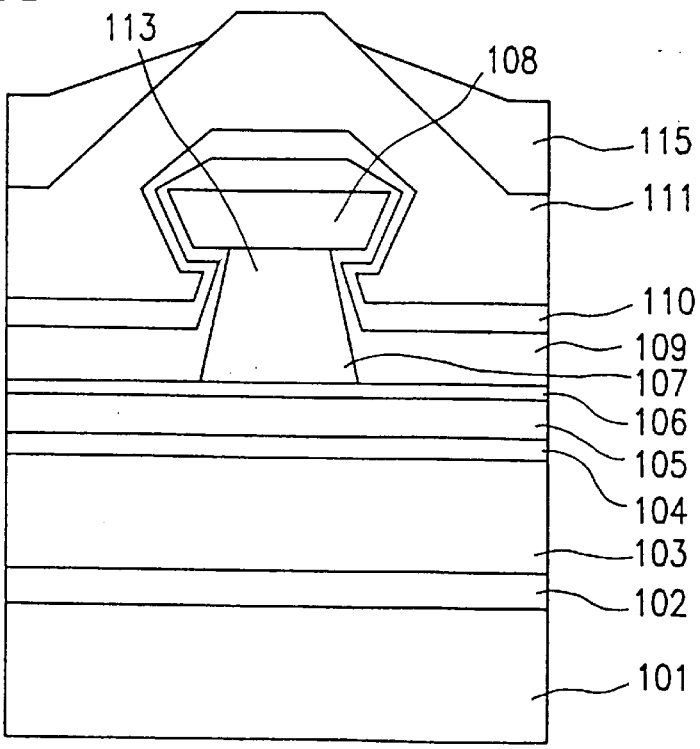

Next, as shown in FIG. 6F, the n-$Al_vGa_{1-v}As$ current blocking layer 109, the n-GaAs first protection layer 110, and the p-GaAs second protection layer 111 are grown in this order so as to entirely cover the ridge 113 and the side faces and upper face of the p-GaAs cap layer 108. An etching protection film 115 (consisting of a resist or the like) is formed on the upper face of the p-GaAs second protection layer 111 except in the vicinity of the summit of the convex portion of the p-GaAs second protection layer 111.

Figure 6G:
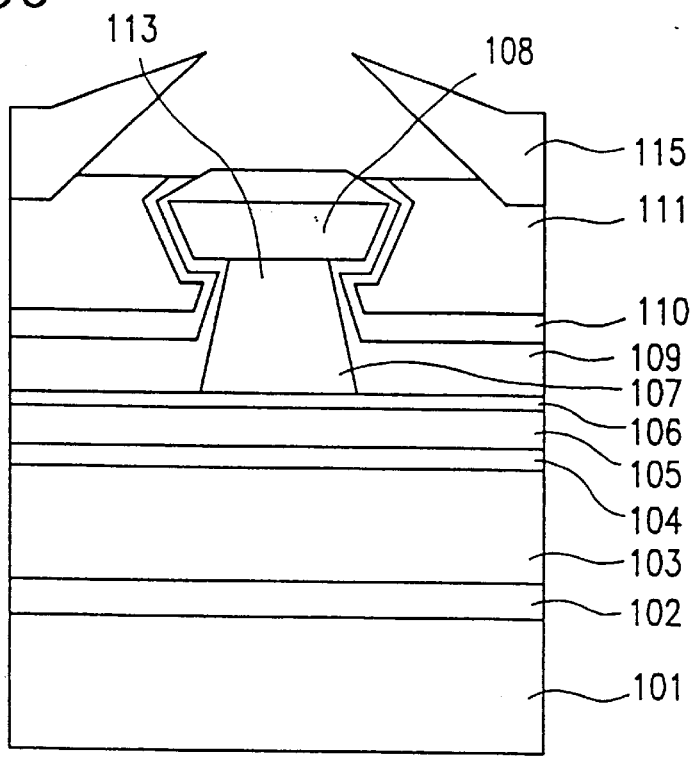

Next, as shown in FIG. 6G, the n-GaAs first protection layer 110 and the p-GaAs second protection layer 111 formed above the ridge 113 are selectively etched by using an etchant which provides a slower etching speed for AlGaAs than GaAs. As the etchant, $NH_4OH:H_2O_2:H_2O=1:30:50$ can be used, for example.

Figure 6H:
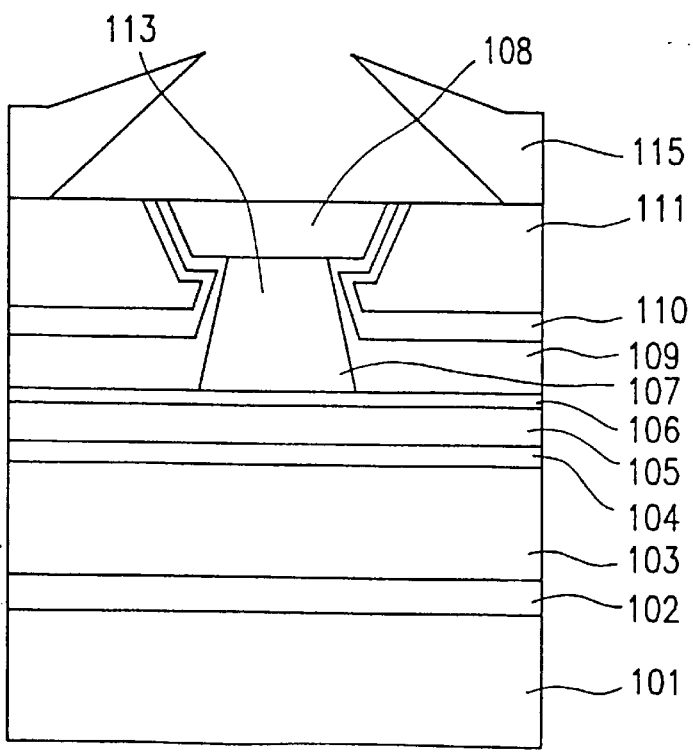

Next, as shown in FIG. 6H, portions of the n-$Al_vGa_{1-v}As$ current blocking layer 109, the n-GaAs first protection layer 110, and the p-GaAs second protection layer 111 located above the ridge 113 and the vicinity thereof are etched so as to obtain a planar face (including the upper face of the p-GaAs cap layer 108), by using an etchant which provides little selectivity between AlGaAs and GaAs. As the etchant, $H_2SO_4:H_2O_2:H_2O=1:8:50$ can be used, for example.

Figure 6I:
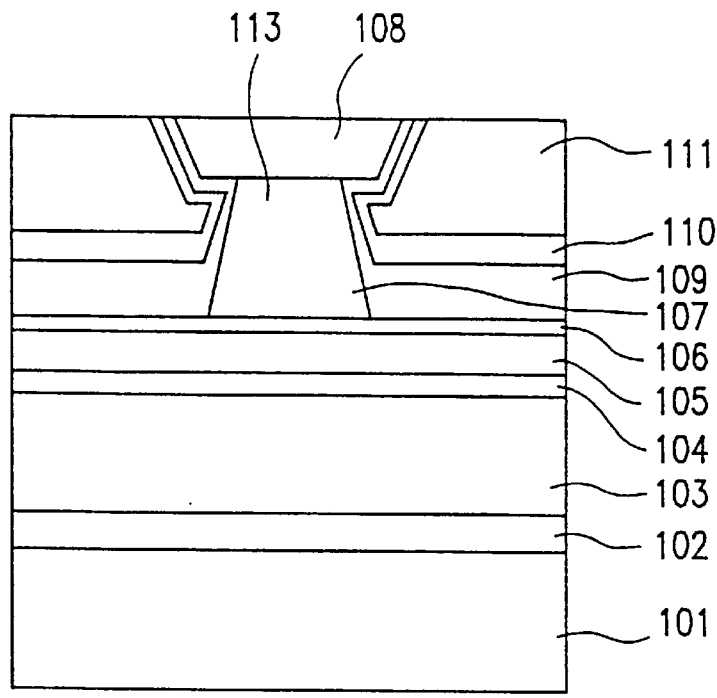

Next, as shown in FIG. 6I, the etching protection layer 115 is removed.

Figure 6J:
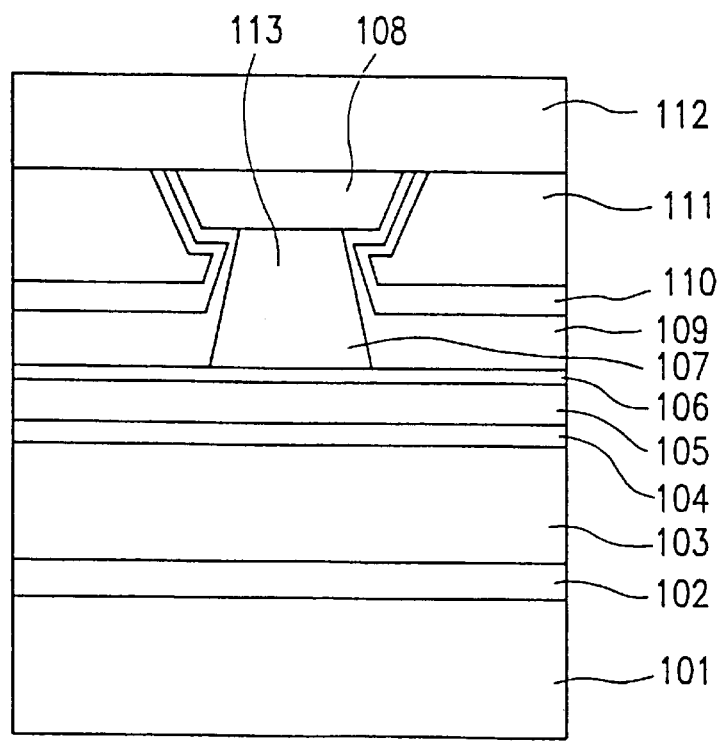

Next, as shown in FIG. 6J, the p-GaAs contact layer 112 is formed over the entire planar face including the p-GaAs cap layer 108.

After the above-described steps illustrated in FIGS. 6A to 6J, an electrode is formed on both of the n-GaAs substrate 101 and the p-Gas contact layer 112, thereby accomplishing the semiconductor laser according to Example 1 of the invention (shown in FIG. 1).

Prerequisites for the material composing the etching stop layer 106 are that: i) the Al content must be smaller than the Al content of the second upper cladding layer 107 in order to minimize the oxidation of the surface exposed after the formation of the ridge 113; and ii) the light absorption by the etching layer 106 must be minimum. These are the reasons why many conventional techniques employ a layer containing Al at a component ratio of 0.2 to 0.25 as the etching stop layer. However, the GaAs etching stop layer 106 (having a thickness of e.g., 30 angstroms) employed in Example 1 does not contain any Al and therefore is very unlikely to be oxidized when exposed to the atmosphere after the p-$Al_uGa_{1-u}As$ second upper cladding layer 107 is removed in the step of forming the ridge 113. As a result, an excellent crystal can be deposited upon the GaAs etching stop layer 106 in the subsequent MOCVD step.

Due to quantum effects, the actual band gap energy of the etching stop layer 106 is larger than that of the active layer. As a result, the etching stop layer 106 does not absorb the light emitted from the active layer. Thus, in accordance with Example 1, the etching stop layer disposed adjacent to the active layer causes substantially no propagation loss.

In Example 1, the ridge 113 is formed so that the width of the lower face of the p-GaAs cap layer 108 is larger than the width of the upper face of the p-$Al_uGa_{1-u}As$ second upper layer 107, in contrast to conventional semiconductor lasers. As a result, the thickness of the n-$Al_vGa_{1-v}As$ current blocking layer 109 formed on the side faces of the p-GaAs cap layer 108 can be reduced, thereby minimizing the area of the n-$Al_vGa_{1-v}As$ current blocking layer 109 (containing the oxidation-susceptible Al component) that is exposed on the surface of the semiconductor laser. Thus, the deterioration in the crystallinity of the contact layer 112 (formed through the third crystal growth) is confined in only a small region of the current blocking layer 109 that is exposed on the surface.

Moreover, in Example 1, each side face of the p-GaAs cap layer 108 constitutes an angle (α as shown in FIG. 1) of 90° or more with respect to the bottom face thereof. The closer toward the substrate 101 the side faces of the p-GaAs cap layer 108 are oriented, the more of the material provided on these side faces accumulates on the side faces of the p-$Al_uGa_{1-u}As$ second upper cladding layer 107 and the upper face of the p-GaAs etching stop layer 106. As a result, less material is provided on the side faces of the p-GaAs cap layer 108.

Furthermore, in Example 1, each side face of the p-$Al_uGa_{1-u}As$ second upper cladding layer 107 constitutes an angle (β as shown in FIG. 1) of 90° or less with respect to the bottom face thereof, thereby bringing the side faces of the p-GaAs cap layer 108 closer to the side faces of the p-$Al_uGa_{1-u}As$ second upper cladding layer 107 than in the case where the angle exceeds 90°. As a result, more material is provided along the side faces of the p-$Al_uGa_{1-u}As$ second upper cladding layer 107 while less material is provided along the side faces of the p-GaAs cap layer 108, thereby allowing a minimum area of the Al-containing layer to be exposed on the surface. As a result, the deterioration in the crystallinity of the contact layer 112 is reduced, thereby effectively reducing the driving voltage of the semiconductor laser.

In order to obtain the aforementioned effects, it is preferable that the width W2 of the lowermost portion of the p-GaAs cap layer 108 and the width W3 of the topmost (summit) portion of the convex ridge of the second upper cladding layer 107 satisfy the relationship 0.3 μm<W2−W3<3 μm.

In Example 1, the width of the n-$Al_yGa_{1-y}As$ current blocking layer 109 formed on the side faces of the p-GaAs cap layer 108 is typically in the range of about 0.05 μm to about 0.35 μm although susceptible to slight variation. Such a thickness accounts for about 60% or less of about 0.6 μm, which is the thickness of the n-$Al_yGa_{1-y}As$ current blocking layer 109 formed in regions other than the ridge 113 (a region other than the portions which are in contact with the side faces of the ridge 113). The width of the portions of the n-$Al_yGa_{1-y}As$ current blocking layer 109 formed on the side faces of the p-GaAs cap layer 108 is preferably about 0.4 μm or less.

The width W1 of the upper face of the p-GaAs cap layer 108, the thickness d1, and the width W3 of the upper face of the p-$Al_uGa_{1-u}As$ second upper cladding layer 107 must satisfy the relationship (W1−W3)/2d1<3. The value of (W1−W3)/2d1 indicates the extent of the p-GaAs cap layer 108 projecting over the upper face of the p-AlGaAs second upper cladding layer 107. Specifically, the p-GaAs cap layer 108 projects more drastically over the upper face of the p-$Al_uGa_{1-u}As$ second upper cladding layer 107 as the value (W1−W3)/2d1 increases. If the value (W1−W3)/2d1 exceeds about 3, the projection of the p-GaAs cap layer 108 becomes excessive and makes itself vulnerable, e.g., by breaking off. Therefore, the value (W1−W3)/2d1 must be less than about 3, and more preferably about 2.5 or less.

The production method according to Example 1 does not employ any dielectric films for the second crystal growth as in the case of the conventional example described above. As a result, the semiconductor layers are prevented from having strain as in the case of the conventional example, thereby providing a highly reliable semiconductor laser.

In Example 1, the n-$Al_yGa_{1-y}As$ current blocking layer 109, the n-GaAs first protection layer 110, and the p-GaAs second protection layer 111, which are formed so as to cover the ridge 113, are removed by first selectively etching the n-GaAs first protection layer 110 and the p-GaAs second protection layer 111 (FIG. 6G) and then etching the n-$Al_yGa_{1-y}As$ current blocking layer 109 (FIG. 6H). By etching the layers 109, 110, and 111 in two steps, it becomes possible to complete the selective etching of the p-GaAs cap layer 108 (FIG. 6C) and the etching of the other layers in relatively short time periods (as compared with the etching time required for etching the three layers 109, 110, and 111 at the same time), thereby reducing the occurrence of unsatisfactory products due to excessive or insufficient etching.

Furthermore, the process of partially etching the current blocking layer 109 is performed by employing an etchant which provides little selectivity and controlling the etching time. On the contrary, if HF or the like is used for selectively etching the n-$Al_yGa_{1-y}As$ current blocking layer 109 above the ridge 113, minute holes may be created adjacent to the p-GaAs cap layer 108. Since the p-GaAs second protection layer 111 and the n-GaAs first protection layer 110 are already removed by etching (FIG. 6G), the non-selective etching process can be completed in a short time, so that the occurrence of unsatisfactory products due to excessive or insufficient etching is minimized according to Example 1.

The n-$Al_yGa_{1-y}As$ current blocking layer 109, the n-GaAs first protection layer 110, the p-GaAs second protection layer 111 interpose both side faces of the ridge 113. (Hereinafter, these three layers will be collectively referred to as a "current blocking structure"). The semiconductor laser of Example 1 adopts the current blocking structure in order to reduce the etching time for the current blocking layer 109 alone. In other words, the current blocking structure includes two n-layers and one p-layer, i.e., the n-Gas first protection layer 110 and the p-GaAs second protection layer 111, so as to make it possible to securely block the electric current flowing within the layers interposed therebetween without overly increasing the thickness of the n-$Al_yGa_{1-y}As$ current blocking layer 109.

The thickness of the n-$Al_yGa_{1-y}As$ current blocking layer 109 should be minimized. However, if the n-$Al_yGa_{1-y}As$ current blocking layer 109 is too thin, the n-GaAs first protection layer 110 may absorb some light. The thickness d2 of the n-$Al_yGa_{1-y}As$ current blocking layer 109 must be larger than at least about 0.2 μm in order to achieve propagation based on the actual refractive index guide. More preferably, d2 is larger than at least about 0.3 μm in order to securely prevent light absorption in the n-GaAs first protection layer 110 located on the n-$Al_yGa_{1-y}As$ current blocking layer 109.

If the total of the thicknesses of the n-$Al_yGa_{1-y}As$ current blocking layer 109 and the n-GaAs first protection layer 110 is too large, the diffusion of a dopant through these n-layers may be enhanced so that the p-$Al_zGa_{1-z}As$ first upper cladding layer may have the n-conductivity type. On the other hand, if the total thickness of the n-layers is too small, the n-layers may break down at the time of current injection or the p-type dopant diffused from the above and below p-layers may impart the layers with the p-type conductivity, possibly resulting in a current leakage. In order to avoid this problem, it is preferable that the thickness d3 of the n-GaAs first protection layer 110 satisfy the relationship d2+d3>0.4 μm in order to prevent current leakage. More preferably, the thickness d3 of the n-GaAs first protection layer 110 satisfies the relationship d2+d3>0.6 μm. In Example 1, the n-$Al_yGa_{1-y}As$ current blocking layer 109 and the n-GaAs first protection layer 110 are formed in greater thicknesses than necessary.

In Example 1, the partial etching of the p-GaAs cap layer 108 and the p-$Al_uGa_{1-u}As$ second upper cladding layer 107 is achieved by wet etching using an etchant containing $H_2SO_4:H_2O_2:H_2O$ at 1:8:50 (FIG. 6C). This etching is timed so that the p-$Al_uGa_{1-u}As$ second upper cladding layer 107 is not entirely removed but rather remains over the entire upper face of the p-GaAs etching stop layer 106.

As an alternative method for this etching step, the p-GaAs cap layer 108 can be selectively etched by using an etchant which provides a slow etching speed for AlGaAs, e.g., an etchant containing $NH_4OH:H_2O_2:H_2O$ at 1:30:50 ("Method A"). In this case, this etching step may be terminated once the p-GaAs cap layer 108 is etched, without etching the p-AlGaAs second upper cladding layer 107. Subsequently, it is also possible to partially etch the p-GaAs cap layer 108 and the p-$Al_uGa_{1-u}As$ second upper cladding layer 107 by an etching method which provides little selectivity between AlGaAs and GaAs to form the shape shown in FIG. 6C. (Method B)

The advantage of Method A (selective etching) is that it is easy to control the etching. The disadvantage is that, since the p-$Al_uGa_{1-u}As$ second upper cladding layer 107 is left without being etched at all, the subsequent etching step with HF may need to be performed for a long time.

The advantage of Method B is that the etching is performed in two steps so that the etching time with the etchant containing $H_2SO_4:H_2O_2:H_2O$ at 1:8:50 can be reduced. The disadvantage is that the increased number of etching steps, which slightly complicates the production process.

In an alternative method to the method of Example 1, it is possible to etch the portion of the n-$Al_yGa_{1-y}As$ current blocking layer 109 present above the ridge 113. In this case, too, the n-Al$_y$Ga$_{1-y}$As current blocking layer 109 has a very small width on each side of the p-GaAs cap layer 108 and therefore is less likely to be etched than in the conventional example.

The p-GaAs contact layer 112 can be grown on the plane including the p-GaAs cap layer 108 by either MOCVD, MBE (molecular beam epitaxy), or LPE (liquid phase epitaxy). Any of the above methods can grow an excellent contact layer 112 because the n-Al$_y$Ga$_{1-y}$As current blocking layer 109 has a very small width on each side of the p-GaAs cap layer 108. The structure of Example 1 is particularly effective for the LPE growth method, in which it is relatively difficult to grow crystal on AlGaAs. The structure of Example 1 is also particularly advantageous due to the small width of n-Al$_y$Ga$_{1-y}$As current blocking layer 109 on each side of the p-GaAs cap layer 108 in the case where electrodes are provided on the semiconductor laser without forming the p-GaAs contact layer 112 because the adhesion between the electrodes and AlGaAs is relatively weak.

The cap layer 108, the first protection layer 110, and the second protection layer 111 can contain Al. For example, these layers can be made of AlGaAs.

EXAMPLE 2

Figure 2:
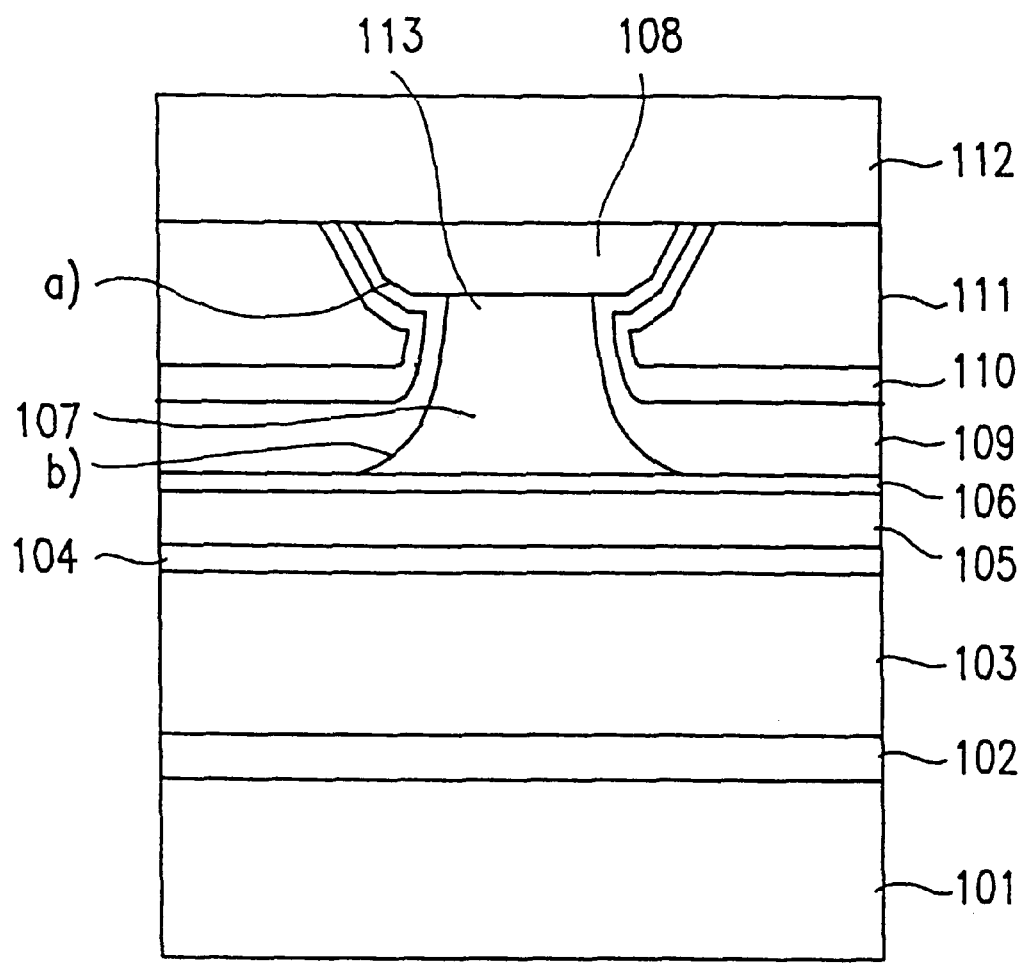
FIG. 2 is a cross-sectional view showing a semiconductor laser device according to Example 2 of the present invention.

With reference to FIG. 2, a semiconductor laser according to Example 2 of the present invention will be described.

The semiconductor laser according to Example 2 has the same structure as that of the semiconductor laser according to Example 1 except for the shapes of the p-GaAs cap layer 108 and the p-Al$_u$Ga$_{1-u}$As second upper cladding layer 107.

The p-GaAs cap layer 108 has a reversed mesa shape. Each side face of the p-GaAs cap layer 108 is composed of two portions, the lower portion (indicated at a) in FIG. 2) being formed closer to the horizontal direction. As a result, the thicknesses of the portions of the n-Al$_y$Ga$_{1-y}$As current blocking layer 109 adjacent to the side faces of the p-Gas cap layer 108 can be further reduced. In order to obtain this structure, the etching time using the etchant containing H$_2$SO$_4$:H$_2$O$_2$:H$_2$O at 1:8:50 in the step of removing portions of the p-GaAs cap layer 108 and the n-Al$_y$Ga$_{1-y}$As current blocking layer 109 is increased as compared with Example 1. Thus, each corner indicated at a) in FIG. 6C is etched to form a new lower portion of the side face.

The p-Al$_u$Ga$_{1-u}$As second upper cladding layer 107 is formed so as to have curved side faces as shown at b) in FIG. 2. By adopting this structure, the distribution of a carrier which is injected into the emission region of the active layer immediately under the ridge 113 becomes similar to the distribution of light, thereby improving the emission efficiency. In order to obtain this structure, the etching time with HF during the step of partially etching away the second upper cladding layer 107 is adapted so that the etching time for the side faces of the ridge 113 alone, performed after removing the p-Al$_u$Ga$_{1-u}$As second upper cladding layer 107 in regions other than the ridge 113, is reduced as compared with Example 1. As a result, the shape of the ridge 113 obtained from the previous step is adequately conserved. The lowermost portion of each curved side face of the p-Al$_u$Ga$_{1-u}$As second upper cladding layer 107 is preferably not so curved that it is asymptotic to the p-GaAs etching stop layer 106 (in which case the carrier distribution would be overly dispersed and lost). Therefore, it is preferable that the lowermost portion of each curved side face of the p-Al$_u$Ga$_{1-u}$As second upper cladding layer 107 constitutes a sufficient angle with respect to the p-GaAs etching stop layer 106.

The cap layer 108, the first protection layer 110, and the second protection layer 111 can contain Al. For example, these layers can be made of AlGaAs.

EXAMPLE 3

Figure 3A:
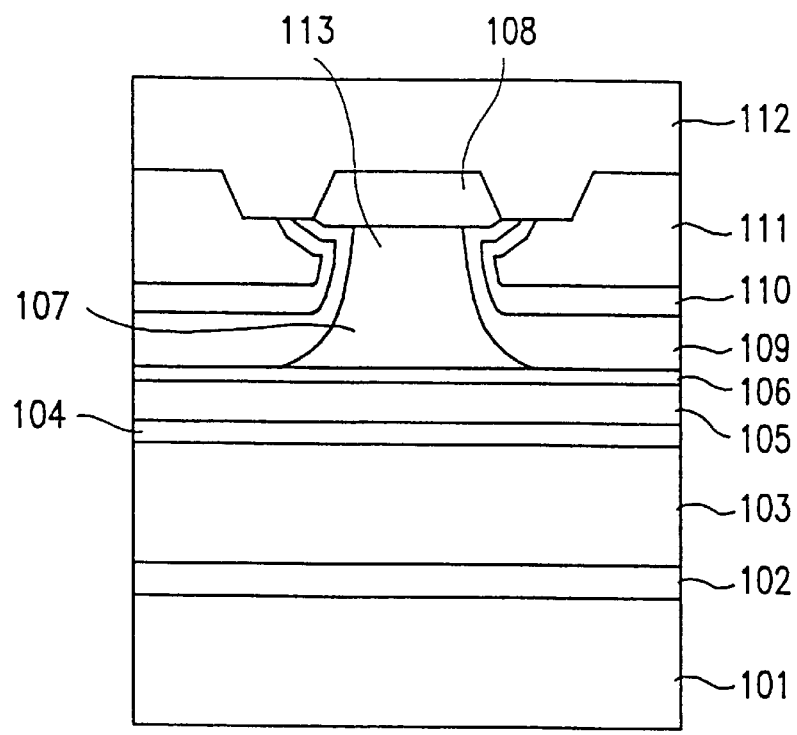
FIGS. 3A and 3B are cross-sectional views showing a semiconductor laser device according to Example 3 of the present invention.
Figure 3B:
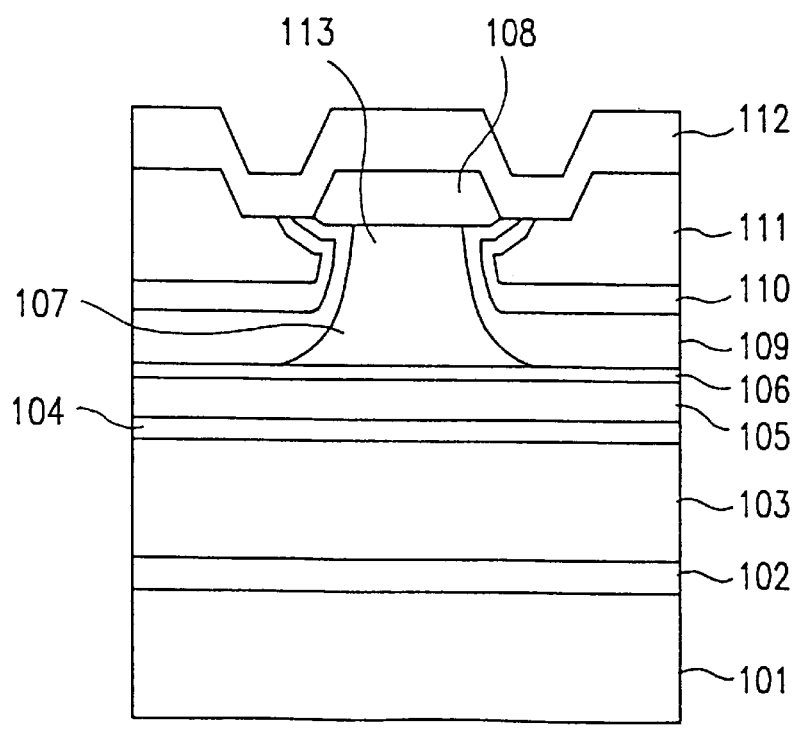

With reference to FIGS. 3A and 3B, a semiconductor laser according to Example 3 of the present invention will be described.

The semiconductor laser according to Example 3 has the same structure as that of the semiconductor laser according to Example 2 except that the side faces of the p-GaAs cap layer 108 as well as portions of the n-AlGaAs current blocking layer 109, the n-type first protection layer 110, and the p-Gas second protection layer 111 in the vicinity of the side faces of the p-GaAs cap layer 108 are etched in a concave shape, upon which the p-GaAs contact layer 112 is formed. FIG. 3A illustrates the case where the p-contact layer 112 is formed by LPE growth. FIG. 3B illustrates the case where the p-contact layer 112 is formed by MOCVD growth.

Figure 7A:
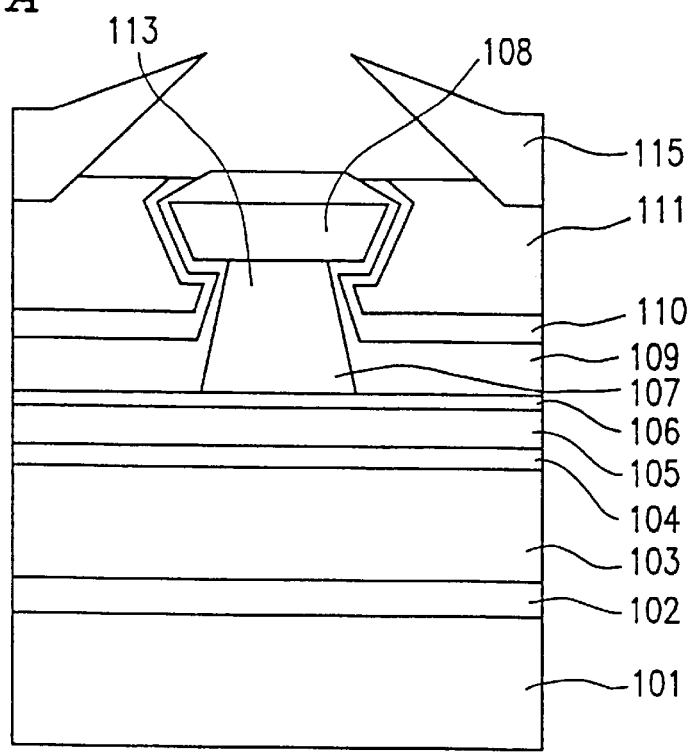
FIGS. 7A and 7B are cross-sectional views illustrating production steps of a semiconductor laser device according to Example 3 of the present invention.
Figure 7B:
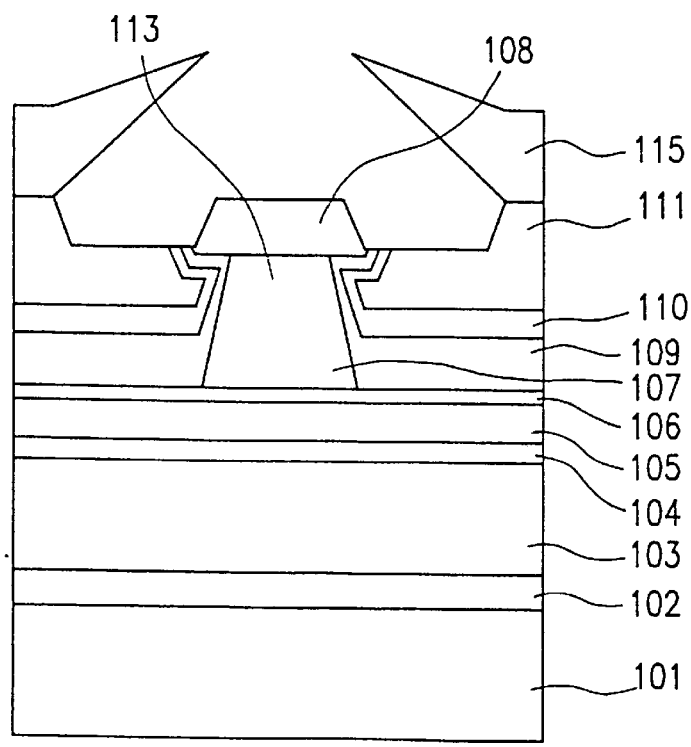
Figure 8:
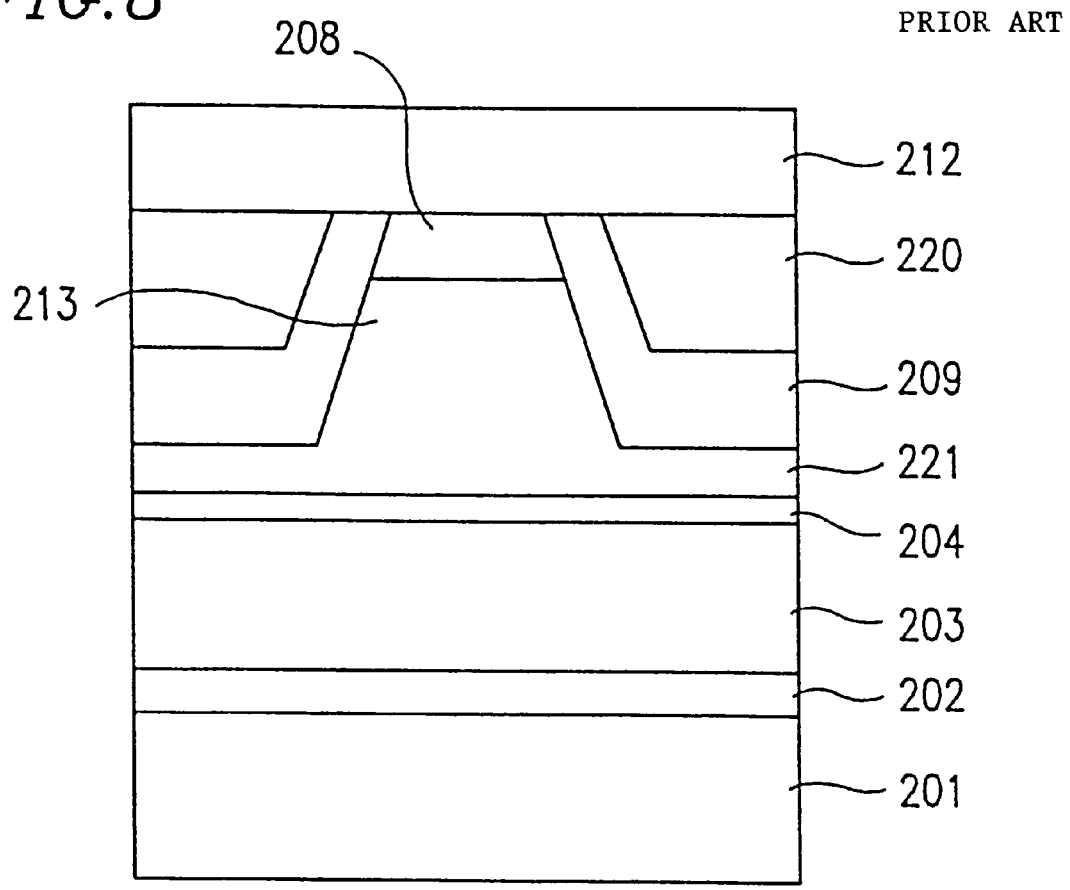
FIG. 8 is a cross-sectional view showing a conventional semiconductor laser device.
Figure 9A:
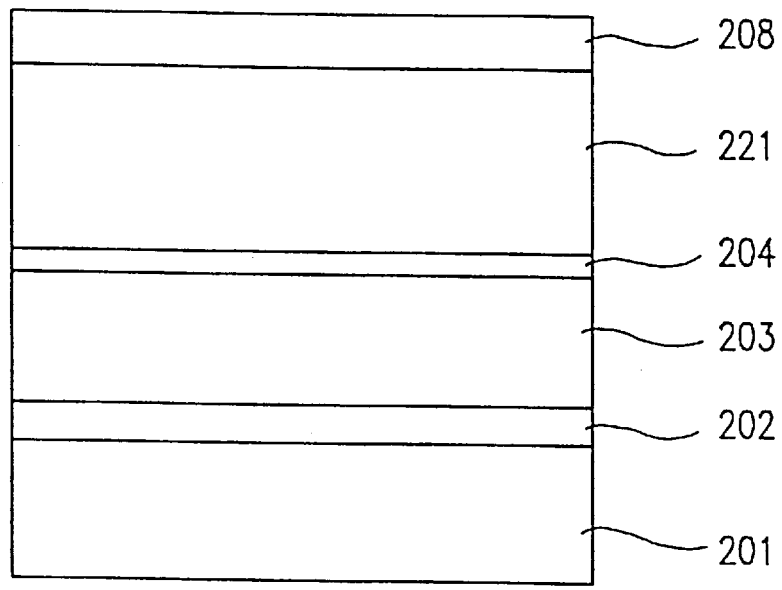
FIGS. 9A to 9D are cross-sectional views illustrating production steps of a conventional semiconductor laser device.
Figure 9B:
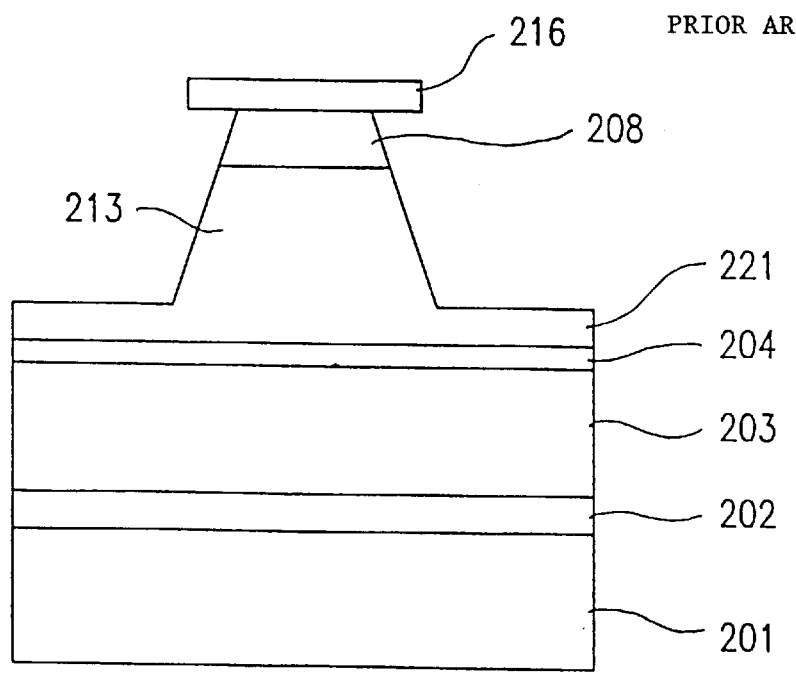
Figure 9C:
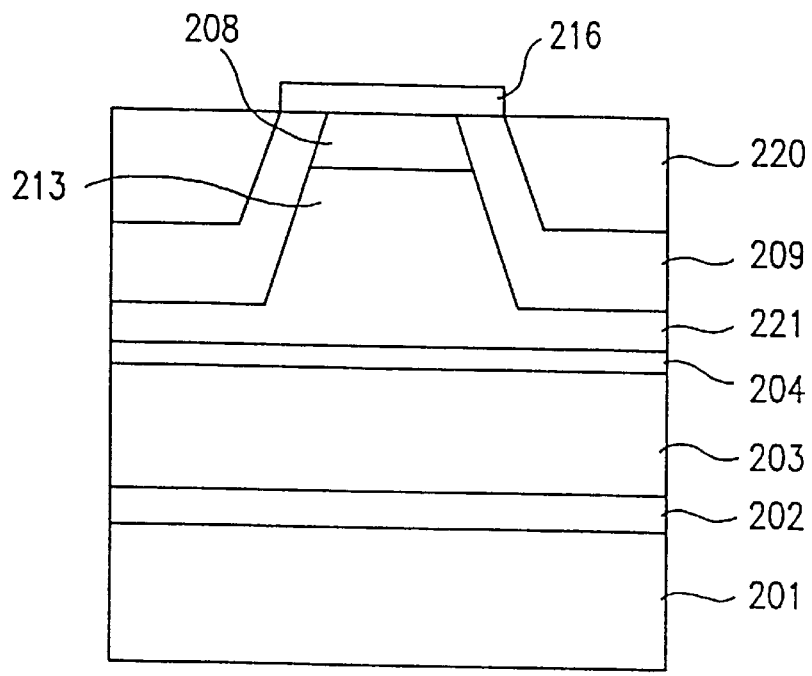
Figure 9D:
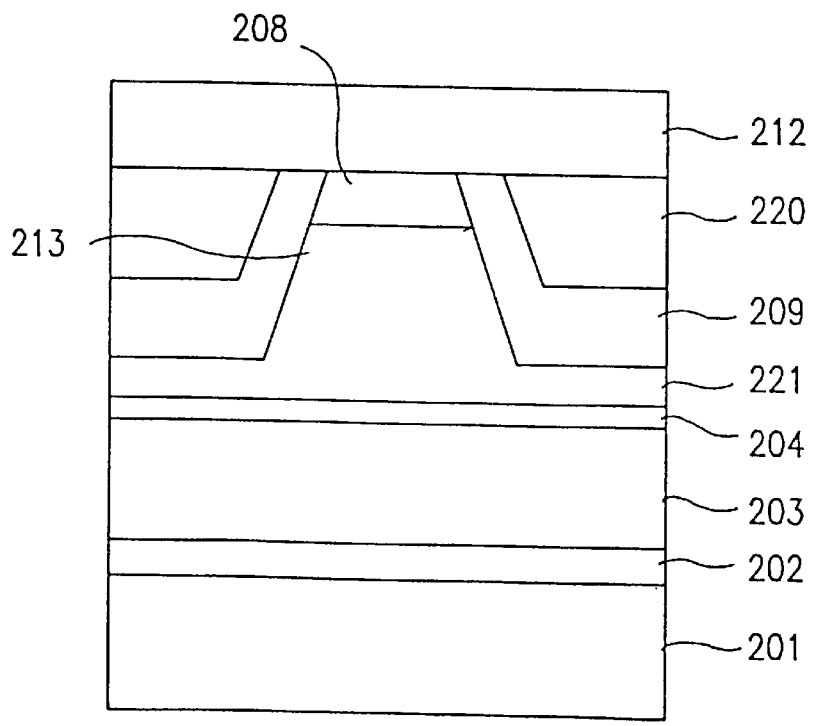

In order to obtain this structure, the step of selectively removing the first and second protection layers 110 and 111, the n-GaAs first protection layer 110 and the p-GaAs second protection layer 111 must be etched longer than in Example 2. By the increased etching time, a large gap is obtained on each side between the n-Al$_y$Ga$_{1-y}$As current blocking layer 109 and the first and second protection layers 110 and 111 (FIG. 7A). Next, the n-Al$_y$Ga$_{1-y}$As current blocking layer 109 on the ridge 113 is removed by an etchant which provides little selectivity between AlGaAs and GaAs. As a result, the side faces and adjacent areas of the p-GaAs cap layer 108 are etched in concave shapes, reflecting the previously formed large gaps (FIG. 7B). Finally, after the etching protection film 115 is removed, the p-GaAs contact layer 116 is formed over the entire surface, including the concave groove portions.

In Example 3, concave grooves are formed including the portions of the n-Al$_y$Ga$_{1-y}$As current blocking layer 109 that are exposed on the surface, upon which the p-GaAs contact layer 112 is grown. In general, when forming a concave groove on a flat substrate and growing a crystal thereon, the crystal growth in the groove is more enhanced so that the surface of the substrate becomes planar over time. Due to this effect, the crystal growth on the n-Al$_y$Ga$_{1-y}$As current blocking layer 109 is enhanced to further minimize the deterioration in crystallinity.

By adopting the structure in which the concave grooves are filled or at least covered with the p-GaAs contact layer 112, the side faces of the p-GaAs cap layer 108 (note that it has p-conductivity) are electrically connected to the p-GaAs second protection layer 111. As a result, the p-GaAs cap layer 108 does not confine electric currents, so that the resistance of the p-GaAs cap layer 108 can be drastically reduced.

The cap layer 108, the first protection layer 110, and the second protection layer 111 can contain Al. For example, these layers can be made of AlGaAs.

EXAMPLE 4

Figure 4:
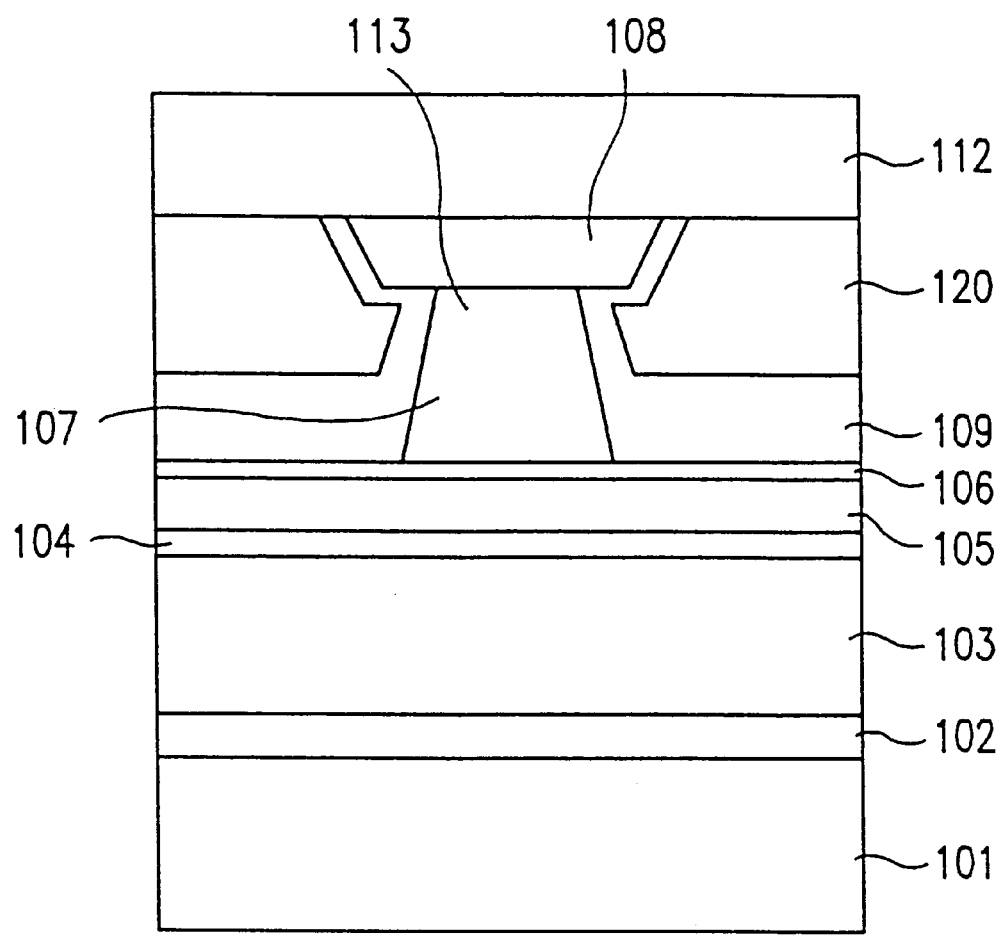
FIG. 4 is a cross-sectional view showing a semiconductor laser device according to Example 4 of the present invention.

With reference to FIG. 4, a semiconductor laser according to Example 4 of the present invention will be described.

The semiconductor laser according to Example 4 has the same structure as that of the semiconductor laser according to Example 1 except that only two layers, i.e., an n-$Al_vGa_{1-v}As$ current blocking layer 109 (thickness: about 0.2 μm to about 1.0 μm) and a p-GaAs protection layer 120 (thickness: about 0.5 μm to about 1.5 μm), are disposed on the outside of the ridge 113. In order to prevent current leakage, the doping amount of the p-GaAs protection layer 120 is reduced to about 1.0E+18 $cm^{-3}$ or less. The structure of Example 4 provides the same overall characteristics as the structures of Examples 1 and 2. However, the structure of Example 4 may be less advantageous than the structures of Examples 1 and 2 in that the p-type conductivity may be erroneously imparted for the n-$Al_vGa_{1-v}As$ current blocking layer 109 due to a slight variation of the growth conditions for the crystal. This is because a p-type dopant may diffuse to the n-$Al_vGa_{1-v}As$ current blocking layer 109 to cause some current leakage.

The cap layer 108 and the protection layer 120 can contain Al. For example, these layers can be made of AlGaAs.

EXAMPLE 5

Figure 5:
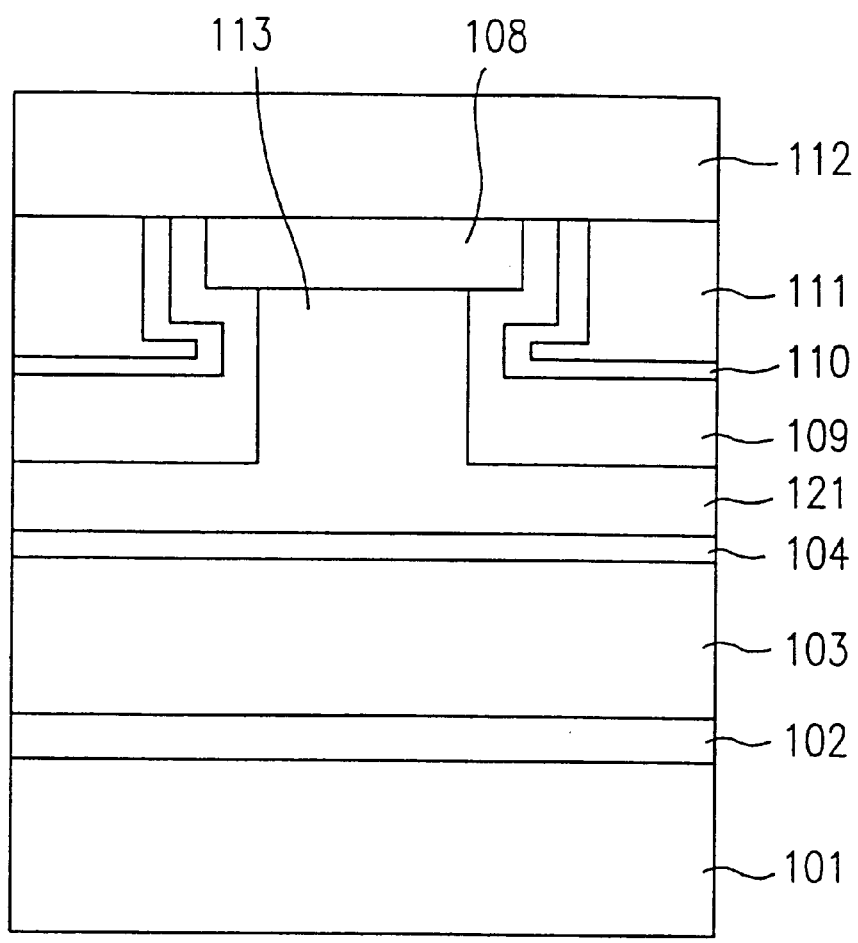
FIG. 5 is a cross-sectional view showing a semiconductor laser device according to Example 5 of the present invention.

With reference to FIG. 5, a semiconductor laser according to Example 5 of the present invention will be described.

Unlike the aforementioned Examples of the invention, the semiconductor laser according to Example 5 does not include the p-GaAs etching stop layer 106. That is, the p-$Al_zGa_{1-z}As$ first upper cladding layer 105, the p-GaAs etching stop layer 106, and the p-$Al_uGa_{1-u}As$ second upper cladding layer 107 are replaced by a p-AlGaAs upper cladding structure 121. Furthermore, the p-type cap layer 108 has a composition represented as $Al_aGa_{1-a}As$ (thickness: about 0.2 μm to about 1.0 μm; $a \leq 0.4$). The n-type first protection layer 110 has a composition represented as $Al_bGa_{1-b}As$ (thickness: about 0.2 μm to about 1.0 μm; $b \leq 0.4$). The p-type second protection layer 111 has a composition represented as $Al_cGa_{1-c}As$ (thickness: about 0.5 μm to about 1.5 μm; $c \leq 0.4$). It should be noted that the cap layer 108, the first protection layer 110, and the second protection layer 111 may or may not include Al. Moreover, the p-$Al_aGa_{1-a}As$ cap layer 108 does not have a reversed mesa shape.

The production method for the semiconductor laser of Example 5 differs from the production method for the semiconductor laser of Example 1 in that the step of partially etching the cap layer and the second upper cladding layer and the step of selectively removing the second upper cladding layer are performed by dry etching. In particular, the step of selectively removing the second upper cladding layer is time-controlled in order to achieve the desired etching because of the lack of etching stop layers (unlike in Example 1). Since the p-$Al_aGa_{1-a}As$ cap layer 108 does not have a reversed mesa shape, the thickness of the n-$Al_vGa_{1-v}As$ current blocking layer 109 adjacent to the side faces of the p-$Al_aGa_{1-a}As$ cap layer 108 increases as compared with Examples 1, 2, and 3, but the thickness is nonetheless smaller than in the conventional example so that the problem inherent in the conventional structure is effectively solved.

Even in the case where a dielectric film like that used in the conventional example is employed, the structures of Examples 1 to 5 of the present invention are effective over the conventional structure for preventing the n-$Al_vGa_{1-v}As$ current blocking layer 109 from being etched at the time of removing the dielectric film with HF and the like.

As described above, in accordance with the present invention, the crystallinity of the contact layer 112 can be improved so that a low-resistance semiconductor laser can be provided.

By employing the production method according to the present invention, dislocations are prevented from occurring in the active region. As a result, a highly reliable semiconductor laser can be produced.

Although the above-described Examples only illustrated an AlGaAs material system, it will be appreciated by those skilled in the art that any other material system that does not contradict or hinder the principle of the present invention, e.g., InGaAl, can alternatively be used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device comprising:
    a semiconductor substrate having a first conductivity type; and
    a semiconductor multilayer structure provided on the semiconductor substrate, the semiconductor multilayer structure including an active layer,
    wherein the semiconductor multilayer structure further includes:
    a lower cladding layer provided below the active layer, the lower cladding layer having the first conductivity type;
    an upper cladding structure provided above the active layer, the upper cladding structure having a second conductivity type; and
    a cap layer provided above the upper cladding structure, the cap layer having the second conductivity type, and
    wherein a ridge is formed in the upper cladding structure, and
    a width W2 of a lower face of the cap layer is larger than a width W3 of an upper face of the ridge, and relationship 0.3 μm<W2−W3<3 μm is satisfied.

2. A semiconductor laser device according to claim 1, wherein the semiconductor multilayer structure further includes:
    a current blocking layer substantially interposing the cap layer and the ridge on both sides, the current blocking layer having the first conductivity type; and
    a protection layer substantially interposing the current blocking layer substantially on both sides.

3. A semiconductor laser device according to claim 2, wherein the active layer has a refractive index larger than a refractive index of the lower cladding layer and a refractive index of the upper cladding structure, and the current blocking layer has a refractive index smaller than the refractive index of the upper cladding structure.

4. A semiconductor laser device according to claim 2, wherein
    the upper cladding structure and the current blocking layer include Al; and
    the cap layer and the protection layer include zero or more Al,
    the cap layer including less Al than the upper cladding structure, and the protection layer including less Al than the current blocking layer.

5. A semiconductor laser device according to claim 1, wherein the upper cladding structure includes:
    a first upper cladding layer having the second conductivity type;
    an etching stop layer having the second conductivity type; and a second upper cladding layer having the second conductivity type, and the ridge is substantially formed in the second upper cladding layer.

6. A semiconductor laser device according to claim 5, wherein the etching stop layer includes a composition different from a composition of the first upper cladding layer and a composition of the second upper cladding layer.

7. A semiconductor laser device according to claim 1, wherein each of side faces of the cap layer constitutes about 90° or more with respect to the lower face of the cap layer.

8. A semiconductor laser device according to claim 7, wherein each of side faces of the upper cladding structure constitutes about 90° or less with respect to a lower face of the upper cladding structure.

9. A semiconductor laser device according to claim 1 satisfying the relationship (W1−W3)/2d1<3, where W1 is a width of the upper face of the cap layer;

W3 is a width of the upper face of the ridge; and d1 is a thickness of the cap layer.

10. A semiconductor laser device according to claim 2, wherein the protection layer includes at least a first protection layer and a second protection layer, which are arranged so that the first protection layer is substantially interposed between the second protection layer and the current blocking layer, the first protection layer having the first conductivity type, and the second protection layer having second conductivity type.

11. A semiconductor laser device according to claim 2 satisfying the relationship d2>0.2 μm, wherein d2 is a thickness of the current blocking layer.

12. A semiconductor laser device according to claim 10, satisfying the relationship d2+d3>0.4 μm, wherein d2 is a thickness of the current blocking layer; and d3 is a thickness of the first protection layer.

13. A semiconductor laser device comprising:

a semiconductor substrate having a first conductivity type; and a semiconductor multilayer structure provided on the semiconductor substrate, the semiconductor multilayer structure including an active layer, wherein the semiconductor multilayer structure further includes:

a lower cladding layer provided below the active layer, the lower cladding layer having the first conductivity type;

an upper cladding structure provided above the active layer, the upper cladding structure having a second conductivity type;

a cap layer provided above the upper cladding structure, the cap layer having the second conductivity type wherein a ridge is formed in the upper cladding structure, and a width W2 of a lower face of the cap layer is larger than a width W3 of an upper face of the ridge;

a current blocking layer substantially interposing the cap layer and the ridge on both sides, the current blocking layer having the first conductivity type; and a protection layer substantially interposing the current blocking layer substantially on both sides, and the upper cladding structure and the current blocking layer include Al;

the cap layer and the protection layer include zero or more Al;

the cap layer including less Al than the upper cladding structure, and the protection layer including less Al than the current blocking layer; and wherein W1−W3/2d1<3, where W1 is a width of the upper face of the cap layer;

W3 is the width of the upper face of the ridge; and d1 is a thickness of the cap layer.

14. A semiconductor laser device according to claim 13, wherein the upper cladding structure includes:

a first upper cladding layer having the second conductivity type;

an etching stop layer having the second conductivity type; and a second upper cladding layer having the second conductivity type, and the ridge is substantially formed in the second upper cladding layer.

15. A semiconductor laser device according to claim 14, wherein the etching stop layer includes a composition different from a composition of the first upper cladding layer and a composition of the second upper cladding layer.

16. A semiconductor laser device according to claim 13, wherein each of side faces of the cap layer constitutes about 90° or more with respect to the lower face of the cap layer.

17. A semiconductor laser device according to claim 16, wherein each of side faces of the upper cladding structure constitutes about 90° or less with respect to a lower face of the upper cladding structure.

18. A semiconductor laser device according to claim 13, wherein the protection layer includes at least a first protection layer and a second protection layer, which are arranged so that the first protection layer is substantially interposed between the second protection layer and the current blocking layer, the first protection layer having the first conductivity type, and the second protection layer having second conductivity type.

19. A semiconductor laser device according to claim 18, satisfying the relationship d2+d3>0.4 μm, wherein d2 is a thickness of the current blocking layer; and d3 is a thickness of the first protection layer.

20. A semiconductor laser device according to claim 13, satisfying the relationship d2>0.2 μm, wherein d2 is a thickness of the current blocking layer.

21. A semiconductor laser device comprising:

a semiconductor substrate having a first conductivity type; and a semiconductor multilayer structure provided on the semiconductor substrate, the semiconductor multilayer structure including an active layer, wherein the semiconductor multilayer structure further includes:

a lower cladding layer provided below the active layer, the lower cladding layer having the first conductivity type;

an upper cladding structure provided above the active layer, the upper cladding structure having a second conductivity type;

a cap layer provided above the upper cladding structure, the cap layer having the second conductivity type wherein a ridge is formed in the upper cladding structure, and a width W2 of a lower face of the cap layer is larger than a width W3 of an upper face of the ridge;

a current blocking layer substantially interposing the cap layer and a ridge on both sides, the current blocking layer having the first conductivity type; and a protection layer substantially interposing the current blocking layer substantially on both sides, and the upper cladding structure and the current blocking layer include Al;

the cap layer and the protection layer include zero or more Al;

the cap layer including less Al than the upper cladding structure, and the protection layer including less Al than the current blocking layer; and a width of a portion of the current blocking layer on a side face of the cap layer is less than or equal to 0.4 μm and greater than zero.

22. A semiconductor laser device according to claim 21, wherein the upper cladding structure includes:

a first upper cladding layer having the second conductivity type;

an etching stop layer having the second conductivity type; and a second upper cladding layer having the second conductivity type, and the ridge is substantially formed in the second upper cladding layer.

23. A semiconductor laser device according to claim 22, wherein the etching stop layer includes a composition different from a composition of the first upper cladding layer and a composition of the second upper cladding layer.

24. A semiconductor laser device according to claim 21, wherein each of side faces of the cap layer constitutes about 90° or more with respect to the lower face of the cap layer.

25. A semiconductor laser device according to claim 24, wherein each of side faces of the upper cladding structure constitutes about 90° or less with respect to a lower face of the upper cladding structure.

26. A semiconductor laser device according to claim 21, satisfying the relationship 0.3 μm<W2−W3<3 μm, where W2 is a width of the lower face of the cap layer; and W3 is a width of the upper face of the ridge.

27. A semiconductor laser device according to claim 21, satisfying the relationship (W1−W3)/2d1<3, where W1 is a width of the upper face of the cap layer;

W3 is a width of the upper face of the ridge; and d1 is a thickness of the cap layer.

28. A semiconductor laser device according to claim 21, wherein the protection layer includes at least a first protection layer and a second protection layer, which are arranged so that the first protection layer is substantially interposed between the second protection layer and the current blocking layer, the first protection layer having the first conductivity type, and the second protection layer having second conductivity type.

29. A semiconductor laser device according to claim 28, satisfying the relationship d2+d3>0.4 μm, wherein d2 is a thickness of the current blocking layer; and d3 is a thickness of the first protection layer.

30. A semiconductor laser device according to claim 21, satisfying the relationship d2>0.2 μm, wherein d2 is a thickness of the current blocking layer.

31. A semiconductor laser device according to claim 4, wherein the upper cladding structure includes:

a first upper cladding layer having the second conductivity type;

an etching stop layer having the second conductivity type; and a second upper cladding layer having the second conductivity type, and the ridge is substantially formed in the second upper cladding layer.

32. A semiconductor laser device according to claim 31, wherein the etching stop layer includes a composition different from a composition of the first upper cladding layer and a composition of the second upper cladding layer.

33. A semiconductor laser device according to claim 4, wherein each of side faces of the cap layer constitutes about 90° or more with respect to the lower face of the cap layer.

34. A semiconductor laser device according to claim 33, wherein each of side faces of the upper cladding structure constitutes about 90° or less with respect to a lower face of the upper cladding structure.

35. A semiconductor laser device according to claim 4, wherein the protection layer includes at least a first protection layer and a second protection layer, which are arranged so that the first protection layer is substantially interposed between the second protection layer and the current blocking layer, the first protection layer having the first conductivity type, and the second protection layer having second conductivity type.

36. A semiconductor laser device according to claim 35, satisfying the relationship d2+d3>0.4 μm, wherein d2 is a thickness of the current blocking layer; and d3 is a thickness of the first protection layer.

37. A semiconductor laser device according to claim 4, satisfying the relationship d2>0.2 μm, wherein d2 is a thickness of the current blocking layer.

* * * * *